United States Patent
Tonegawa et al.

(10) Patent No.: US 8,435,862 B2
(45) Date of Patent: May 7, 2013

(54) METHOD OF MANUFACTURING SEMICONDUCTOR DEVICE

(75) Inventors: Takashi Tonegawa, Kanagawa (JP); Tomotake Morita, Kanagawa (JP); Norihiko Matsuzaka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/069,421

(22) Filed: Mar. 23, 2011

(65) Prior Publication Data

US 2011/0237074 A1  Sep. 29, 2011

(30) Foreign Application Priority Data

Mar. 29, 2010 (JP) ................................. 2010-074594

(51) Int. Cl.
*H01L 21/28052* (2006.01)

(52) U.S. Cl.
USPC ........... 438/305; 438/664; 438/683; 438/586; 438/745; 438/754

(58) Field of Classification Search .................. 438/630, 438/649, 657, 655, 664, 682, 721, FOR. 360, 438/651, FOR. 385, FOR. 405; 257/382, 257/384, 412, 413, 754, 755, 768, E29.156, 257/E29.161, E23.157, E21.203, E29.199, 257/E21.296, E21.619, E21.634
See application file for complete search history.

(56) References Cited

U.S. PATENT DOCUMENTS

| 5,668,065 | A | * | 9/1997 | Lin | ............................... | 438/303 |
| 6,096,629 | A | * | 8/2000 | Tsai et al. | ..................... | 438/570 |
| 7,566,662 | B2 | | 7/2009 | Futase et al. | | |
| 2003/0235984 | A1 | * | 12/2003 | Besser et al. | .................. | 438/683 |
| 2006/0003534 | A1 | * | 1/2006 | Roh et al. | ...................... | 438/300 |
| 2009/0317966 | A1 | | 12/2009 | Matsuo et al. | | |

FOREIGN PATENT DOCUMENTS

JP  2009-111214  5/2009

OTHER PUBLICATIONS

Ann Lauwers et al.—Materials aspects, electrical performance, and scalability of Ni silicide towards sub-0.13 μm technologies—Feb. 20, 2001; accepted Aug. 13, 2001—pp. 2026-2037.

* cited by examiner

*Primary Examiner* — Olik Chaudhuri
*Assistant Examiner* — Quovaunda V Jefferson
(74) *Attorney, Agent, or Firm* — Young & Thompson

(57) ABSTRACT

The method of manufacturing a semiconductor device comprises forming a metal film over silicon regions and insulating films; performing a first heat treatment under an oxygen atmosphere containing oxygen as a main ingredient, to form a first silicide film in the silicon region by reacting the metal film and the silicon region, and to simultaneously form a metal oxide by oxidizing the entire surface of the metal film from the surface side thereof; and selectively removing the metal oxide and the unreacted metal film using a chemical.

9 Claims, 9 Drawing Sheets

METHOD OF MANUFACTURING SEMICONDUCTOR DEVICE

This application is based on Japanese patent application No. 2010-074594, the content of which is incorporated herein by reference.

BACKGROUND

1. Technical Field

The present invention relates to a method of manufacturing a semiconductor device, and specifically to a method of manufacturing a semiconductor device including a step of forming a silicide film.

2. Related Art

As high integration of semiconductor elements proceeds, it is required that the gate dimensions of a transistor or the interconnect width thereof is miniaturized, and the resistance of gate and source/drain regions decreases for high-speed operation of the transistor. As a technique for solving such a requirement, a salicide process is used in which the resistance of the gate and source/drain regions made of polysilicon is reduced by forming a low-resistance silicide compound of a metal and silicon in a self-aligned manner.

In the salicide process, metals such as Ni, Co, and Ti are formed on a wafer in which the gate and source/drain regions made of polysilicon are formed, and heat treatment is applied thereto. Thereby, the metal is diffused into silicon, or silicon is diffused into the metal, and a silicide film is formed by reacting them with each other. On the other hand, unreacted metal deposited on an element isolation insulating film and a sidewall is selectively removed using a chemical such as a sulfuric hydrogen peroxide mixture or nitrohydrochloric acid after heat treatment. Thereby, the silicide film is selectively formed in the gate and source/drain regions.

Among materials included in the silicide film, nickel silicide which is a compound of nickel and silicon is attracting attention due to an advantage such as stable resistance of the minute gate and source/drain region.

Japanese Unexamined Patent Publication No. 2009-111214 discloses a technique for forming the silicide film in the gate and source/drain regions. Procedures disclosed in the above document will be described with reference to FIGS. 8A, 8B, 8C, 9A and 9B.

First, a semiconductor element is created by forming, on a silicon substrate 1, a shallow trench isolation (STI) 2 used as an element isolation insulating film, a gate electrode 3, a sidewall 4, a gate insulating film 5, an extension region 6, and a source/drain region 7 (FIG. 8A). Next, a metal film 8 such as a Ni—Pt alloy film is formed on the entire surface of the silicon substrate 1 (FIG. 8B). Thereafter, annealing is performed at a temperature of 200 to 350° C., for 30 to 120 seconds under an $N_2$ atmosphere, by lamp annealing and the like, and a silicide film 9 of $Ni_2Si$ is formed (FIG. 8C). Subsequently, the unreacted metal film 8 is selectively removed using a sulfuric hydrogen peroxide mixture (FIG. 9A). Next, annealing is performed at a temperature between a temperature higher than 350° C. and a temperature of 600° C., for 30 to 120 seconds, under the $N_2$ atmosphere, by lamp annealing and the like, and the silicide film 9 is formed as a silicide film 11 of NiSi (FIG. 9B).

In addition, Japanese Unexamined Patent Publication No. 2010-28084 discloses procedures for forming the silicide film through the following procedures.

1) Similarly to a general salicide technique, a source/drain diffusion layer made of Si, SiGe, SiC or the like is formed, and Pt-containing Ni is formed on the entire surface of the wafer.

2) Si or SiGe of the source/drain diffusion layer is silicified by performing a first heat treatment, and a Ni silicide film is formed.

3) An unreacted Ni film located on an element isolation insulating film and the like is oxidized by heat treatment of an oxidizing atmosphere, and a Ni oxide film is formed.

4) The composition of the Ni silicide film is set to be Si-rich by performing a second heat treatment having a higher temperature than that of the first heat treatment.

5) The Ni oxide film and Pt are removed using nitrohydrochloric acid.

In a technique disclosed in the above document, the nitrohydrochloric acid is used as a chemical for removing the metal film. Therefore, after the first heat treatment, first, the silicide film is formed as NiSi having a high oxidation resistance to the nitrohydrochloric acid by the high-temperature second heat treatment. Next, the unreacted metal film is removed using the nitrohydrochloric acid. For this reason, the high-temperature second heat treatment is performed in a state where the unreacted metal film remains on the element isolation insulating film. Consequently, in order to prevent the metal film located on the element isolation insulating film from flowing into the source/drain region by migration in the high-temperature second heat treatment, after the first heat treatment and before the high-temperature second heat treatment, the unreacted metal film located on the element isolation insulating film and the like is oxidized by heat treatment of an oxidizing atmosphere, and processing for forming an oxide film is performed.

Herein, though the first heat treatment is carried out in a nitrogen atmosphere, for example, with a temperature of 300° C., it is disclosed that the first heat treatment may be performed at an oxygen concentration of equal to or less than 1%. In addition, it is disclosed that the heat treatment of the oxidizing atmosphere is performed at a temperature of 300° C. or so, and the second heat treatment is performed at a high temperature of equal to or more than 400° C.

However, in the past, for example, in the method disclosed in Japanese Unexamined Patent Publication No. 2009-111214, there has been a problem that a Si oxide 12 (see FIGS. 9A and 9B) is locally formed on the surface of the silicide film. When such an oxide 12 is formed, variation of sheet resistance of the silicide film 11 increases, and poor electrical conduction of a contact occurs.

Such an oxide 12 is considered to be formed as followed. First, since silicide reaction by initial annealing is insufficient, the silicide film richer in Ni (richer in metal) than $Ni_2Si$ is locally formed at the surface side of the silicide film. Next, when the unreacted metal film 8 is selectively removed by using a sulfuric hydrogen peroxide mixture, it is considered that Ni is eluted from the Ni-rich silicide film and remaining Si reacts with oxygen, so that the oxide 12 is formed.

In addition, especially, when thinning of the silicide film proceeds, there also occurs a problem that abnormal growths 13 (see FIG. 9B) is easily generated in the direction of the interface of the silicide film 9 with an STI 2 or the direction of the interface thereof with the sidewall 4, and an increase in a junction leakage current or uniformity of the sheet resistance is deteriorated. A cause for generating such abnormal growth 13 includes a fact that since Ni located on the STI 2 or the sidewall 4 flows and diffuses into silicon during the initial annealing, the thickness of the silicide film easily increases.

Therefore, measures for preventing Ni located on the insulating film from flowing into silicon are also required.

In the technique disclosed in Japanese Unexamined Patent Publication No. 2010-28084, after the first heat treatment (initial annealing), the unreacted metal film located on the element isolation insulating film and the like is oxidized by the heat treatment of the oxidizing atmosphere, and processing for forming the oxide film is performed. However, in this method, the formation of the oxide 12 or the generation of the abnormal growth 13, as mentioned above, cannot be prevented. In this method, similarly to the technique disclosed in Japanese Unexamined Patent Publication No. 2009-111214, since Ni located on the element isolation insulating film or the sidewall flows and diffuses into silicon during the first heat treatment, the generation of the abnormal growth 13 cannot be prevented.

SUMMARY

In one embodiment, there is provided a method of manufacturing a semiconductor device, said semiconductor device comprises a silicide film in a silicon region, which comprises silicon as a main ingredient, isolated by an insulating film, comprising: forming a metal film over the silicon region and the insulating film; performing a first heat treatment under an oxygen atmosphere containing oxygen as a main ingredient, to form the silicide film in the silicon region by reacting the metal film and the silicon region, and to simultaneously form a metal oxide film by oxidizing the entire surface of the metal film from the surface side thereof; and selectively removing the metal oxide film and the unreacted metal film using a chemical.

According to this configuration, since the formation of the silicide film and the formation of the metal oxide film are simultaneously performed, and in the thermal oxidation treatment step, since the surface of the metal film is oxidized while performing the silicide reaction, reaction causing the generation of the oxide at the time of selectively removing the unreacted metal film later using a sulfuric hydrogen peroxide mixture can prevent the insufficient silicide film from being formed. In addition, since the metal oxide is formed by oxidizing even the surface side of the metal film located on the insulating film, it is possible to prevent an extra metal material from flowing into the silicon region, and to prevent the abnormal growth from being generated.

Meanwhile, arbitrary combinations of the above-mentioned components, and ones obtained by conversion of the expression of the invention among methods, devices and the like are also effective as the aspect of the invention.

According to the invention, it is possible to prevent variation of the sheet resistance of the silicide film and to reduce the junction leakage current of the semiconductor device including the silicide film.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1A:
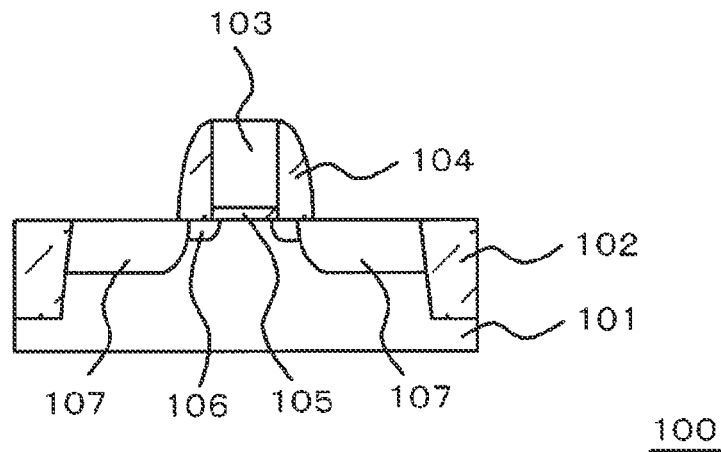
FIGS. 1A to 1C are process cross-sectional views illustrating an example of procedures for manufacturing a semiconductor device according to an embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

In the following embodiments, a case where nickel silicide is formed as a silicide film will be described by way of example.

The important thing in forming a nickel silicide is to form a lowest-resistance monosilicide phase (NiSi) of a plurality of types of crystal phases of nickel silicide, and to control the phase so as not to be phase-transferred to other crystal phases.

However, for example, when silicide reaction proceeds due to the influence of excess heat and the like, a silicon-rich disilicide phase ($NiSi_2$) is formed rather than NiSi. In addition, it is known that the volume of $NiSi_2$ is approximately 1.6 times that of NiSi. When $NiSi_2$ is formed, $NiSi_2$ is abnormally grown in a spike shape so as to reach the vicinity of the PN junction portion, and thus a junction leakage current increases.

In addition, a reduction in the junction depth of source/drain region is required in a recent transistor in order to suppress a short channel effect. Formation of a thin, uniform and flat film is required even in the silicide film in order to correspond to a distribution profile of impurity elements for forming shallow junction. For this reason, in a miniaturized transistor, it is preferable that a Ni film used for silicification is thinly formed. However, when the Ni film used in silicification is thinly formed, $NiSi_2$ that causes a junction leakage current is easily formed even at a low temperature (see A. Lauwers et al., "Materials aspects, electrical performance, and scalability of Ni silicide towards sub-0.13 μm technologies", J. Vac. Sci. Technol. B 19 (6) 2026-2037, November/December 2001, FIG. 1).

For this reason, as the miniaturization thereof proceeds, it is required that the formation of silicide carried out at a temperature as low as possible in order to prevent silicide reaction from proceeding to $NiSi_2$.

However, in the past, when initial annealing is set to a low temperature or a short period of time, particularly, in order to prevent the formation of $NiSi_2$, there has been a problem that a Si oxide 12 (see FIGS. 9A and 9B) is locally is formed on the surface of the silicide film, and variation of the sheet resistance of the silicide film 11 increases, or poor electrical conduction of a contact occurs. Although the above-mentioned problem can be avoided by setting the initial annealing to a high temperature or a long period of time, $NiSi_2$ is formed in such a case.

In addition, particularly, when thinning of the silicide film is advanced, there also occurs a problem that $NiSi_2$ is easily formed, or abnormal growths 13 (see FIG. 9B) in the direction of the interface of the silicide film with an STI or the direction of the interface thereof with a sidewall are easily generated due to the formation of $NiSi_2$, or the junction leakage current increases.

In the following embodiment, after a metal film for performing silicification is formed, a thermal oxidation treatment step is carried out in which a first heat treatment is performed at a relatively low temperature between 220° C. to 300° C. in an oxygen atmosphere containing oxygen as a main ingredient.

According to this procedure, in the thermal oxidation treatment step, silicide reaction occurs between the metal film and the silicon, and simultaneously the entire surface of the metal film is oxidized, and thus a metal oxide film is formed on the entire surface of the metal film. For this reason, it is possible to uniformly control the thickness of the silicide film, and to prevent the silicide film rich in a metal such as Ni from being locally formed even when the heat treatment is performed at a relatively low temperature. Thereby, when the metal oxide film and the unreacted metal film are removed using a chemical such as a sulfuric hydrogen peroxide mixture, it is possible to prevent the oxide from being partially formed. Thereby, it is possible to prevent the oxide from being partially formed on the surface of the silicide film.

In addition, since even the metal film located on an insulating film such as the element isolation insulating film or the sidewall is oxidized from the surface side thereof in the thermal oxidation treatment step, it is possible to prevent a metal such as Ni from flowing and diffusing into the silicon during the first heat treatment. In addition, since the first heat treatment is performed at a relatively low temperature of equal to or higher than 220° C. and equal to or lower than 300° C., excess heat is never applied thereto. Thereby, it is also possible to prevent the abnormal growth made of $NiSi_2$ in the direction of the interface of the silicide film with the STI or the direction of the interface thereof with the sidewall from being generated.

FIGS. 1A to 1C and FIGS. 2A and 2B are process cross-sectional views illustrating an example of procedures for manufacturing a semiconductor device 100 according to the embodiment.

First, using a well-known method, a semiconductor element is created by forming, on a silicon substrate 101, an STI 102 used as an element isolation insulating film, a gate electrode 103, a sidewall 104, a gate insulating film 105, an extension region 106, and a source/drain region 107 (FIG. 1A). Meanwhile, the source/drain region 107 can be formed of materials such as SiGe and SiC. In the embodiment, the gate electrode 103 can be formed by, for example, polysilicon.

Next, a natural oxide film formed on the gate electrode 103 and the source/drain region 107 is removed using a well-known chemical dry cleaning technique and the like (Japanese Unexamined Patent Publication No. 2007-281298).

Figure 1B:
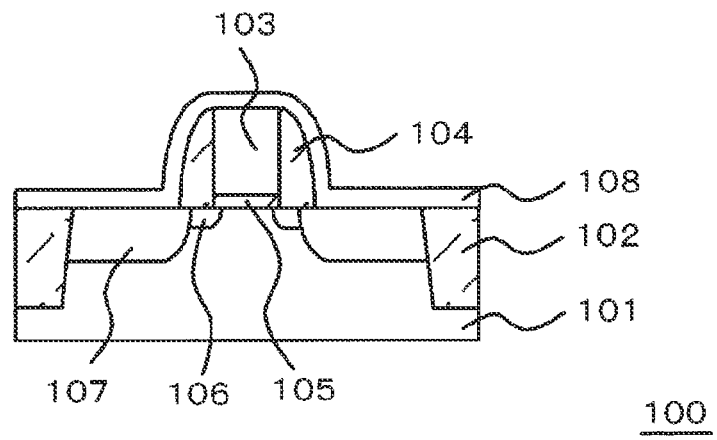

Thereafter, a metal film 108 for performing silicide reaction is formed on the entire surface of the silicon substrate 101 by a sputtering method (FIG. 1B). The metal film 108 can be configured to include Ni. The metal film 108 can be formed of Ni or Ni alloy. The Ni alloy can be configured to include at least one of Pt or Pd. In addition, the metal film 108 can be formed of a laminated film including at least one of Ni or Ni alloy. In addition, the metal film 108 can be formed of, for example, a laminated film of a Ni film and a Pt film or a Pd film.

In the embodiment, the metal film 108 can be formed of a Ni—Pt alloy film. In this case, in the metal film 108, the content of Pt can be set to be, for example, equal to or more than 1 at % and equal to or less than 20 at %. The thickness of the metal film 108 can set to be, for example, equal to or more than 5 nm and equal to or less than 15 nm. The temperature of the wafer at the time of forming the metal film 108 can be set to be, for example, equal to or lower than 50° C. (specifically, for example, room temperature). The metal film 108 is formed at such a low temperature, whereby it is possible to suppress the silicide reaction during the film formation. Thereby, Ni is diffused into the silicon, and finally, it is possible to prevent a spike caused by the formation of $NiSi_2$ from being generating.

In addition, as a method of forming the metal film 108, a chemical vapor deposition (CVD) method can be used in addition to the sputtering method.

Figure 1C:
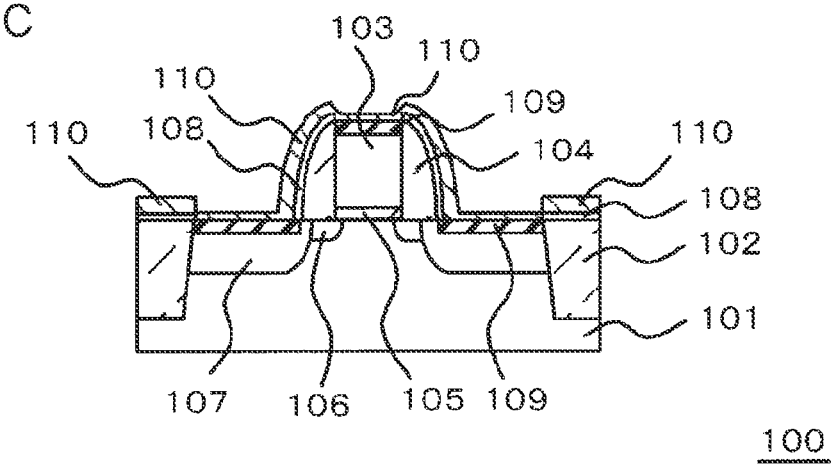

Next, the thermal oxidation treatment step of performing a first annealing (first heat treatment) is carried out. In the embodiment, the first annealing is carried out in an oxygen atmosphere containing oxygen as a main ingredient. Here, the concentration of oxygen in the oxygen atmosphere can be set to be highest among the elements included in process gas. The concentration of oxygen in the oxygen atmosphere can be set to be, for example, equal to or more than 50 vol %. Further, the concentration of oxygen in the oxygen atmosphere can be set to be equal to or more than 90 vol %. In addition, it is possible to be set to oxygen alone (100%). Thereby, a first silicide film 109 is formed of the metal film 108 in contact with the silicon substrate 101 and the gate electrode 103, and the entire surface of the metal film 108 is oxidized, and thus a metal oxide 110 is formed (FIG. 1C). Here, the metal oxide 110 can be formed of a Ni oxide. In addition, it is preferable to set the conditions so that the crystal phase of the first silicide film 109 becomes Pt-added dinickel silicide $(Ni_{2-x}(Pt)_xSi)(0<x<2)$. The metal film 108 in contact with the STI 102 or the sidewall 104 becomes the unreacted metal film 108 as it is, and the surface side thereof becomes the metal oxide 110.

The first annealing can be performed in the oxygen atmosphere by, for example, a lamp annealing method. Here, for example, a temperature rising step is performed at a speed of 5° C./second, and thus it is possible to perform annealing at a preset temperature between equal to or higher than 220° C. and equal to or lower than 300° C., for 20 seconds to 120 seconds.

The temperature of the first annealing is set to be equal to or higher than 220° C. to thereby sufficiently attain the silicide reaction, so that the first silicide film 109 can be formed to a desired film thickness. In addition, the temperature of the first annealing is set to be equal to or lower than 300° C., so that even when the minute semiconductor element is manufactured, it is possible to prevent heat from being excessively imparted, and to prevent $NiSi_2$ from being formed.

In addition, the first annealing may be performed using a flash lamp annealing method, a furnace annealing method, a heater heating method and the like other than the lamp annealing method. In addition, while the surface is oxidized using oxygen containing plasma, the wafer can also be heated. As an annealing atmosphere, annealing can also be performed in mixed gas of inert gas such as oxygen and nitrogen. It is possible to reduce the thickness of the metal oxide 110 by decreasing the concentration of oxygen in process gas under the same temperature. It is also possible to adjust the concentration of oxygen in order to obtain a desired thickness of the silicide film.

Figure 2A:
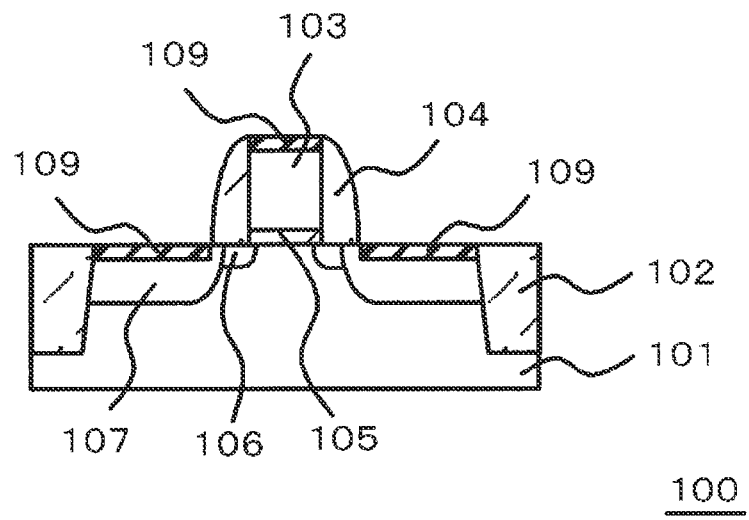
FIGS. 2A and 2B are process cross-sectional views illustrating an example of the procedures for manufacturing the semiconductor device according to the embodiment of the invention.

Next, the metal oxide 110 and the unreacted metal film 108 located on the insulating film are selectively removed using a sulfuric hydrogen peroxide mixture (FIG. 2A). The sulfuric hydrogen peroxide mixture can be produced by mixing, for example, a sulfuric acid aqueous solution of which the concentration of sulfuric acid is 96 wt % and a hydrogen peroxide solution of which the concentration of hydrogen peroxide is 30 wt %. In this case, the volume ratio of the sulfuric acid aqueous solution can be set to be equal to or more than 1 and equal to or less than 5. The temperature of the sulfuric hydrogen peroxide mixture can be regulated between, for example, 120° C. and 200° C., and the treating time can be set to be equal to or more than 30 seconds and equal to or less than 200 seconds. Thereby, it is possible to prevent the remainder of the metal oxide 110 or the remainder of Ni or Pt derived from the unreacted metal film 108 from being generated.

Figure 2B:
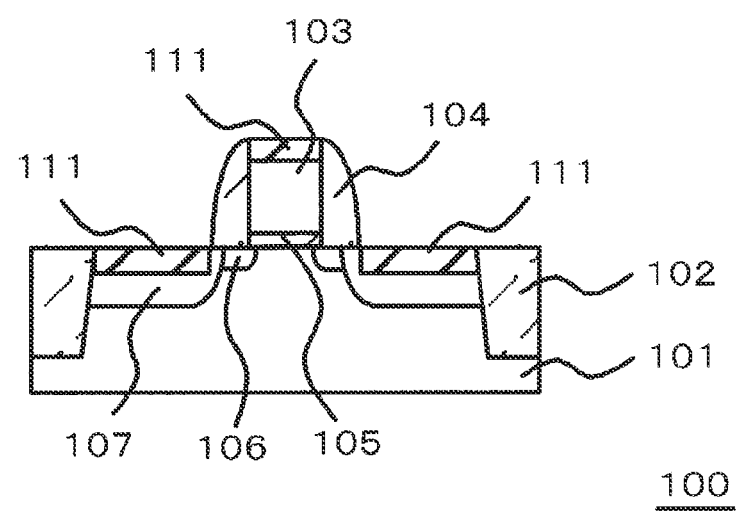

Next, a second heat treatment step of performing second annealing (second heat treatment) is carried out. The first silicide film 109 is phase-transferred by the second annealing, and thus a second silicide film 111 having a lower resistance is formed (FIG. 2B). The temperature of the second annealing can be set to a higher temperature than the temperature of the first annealing. In the embodiment, it is possible to increase the content of silicon in the silicide film by the second annealing. The second annealing can be performed under an inert gas atmosphere. In addition, the second annealing can be performed by the lamp annealing method, in for example, a nitrogen atmosphere. Here, for example, anneal can be performed at a preset temperature between equal to or higher than 400° C. and equal to or lower than 600° C., for 20 seconds to 120 seconds.

Specifically, in the embodiment, the first silicide film 109 which is dinickel silicide is formed of the second silicide film 111 of which the crystal phase is Pt-added nickel monosilicide $(Ni_{1-y}(Pt)_ySi)$ $(0<y<1)$ by the second annealing. As described above, in the embodiment, the semiconductor device 100 having the second silicide film 111 is manufactured.

(Example)

The second silicide film 111 was formed on the N-type source/drain region 107 by the same procedure as described in the above-mentioned embodiment, and the sheet resistance and the junction leakage current of the second silicide film 111 were measured.

Figure 3:
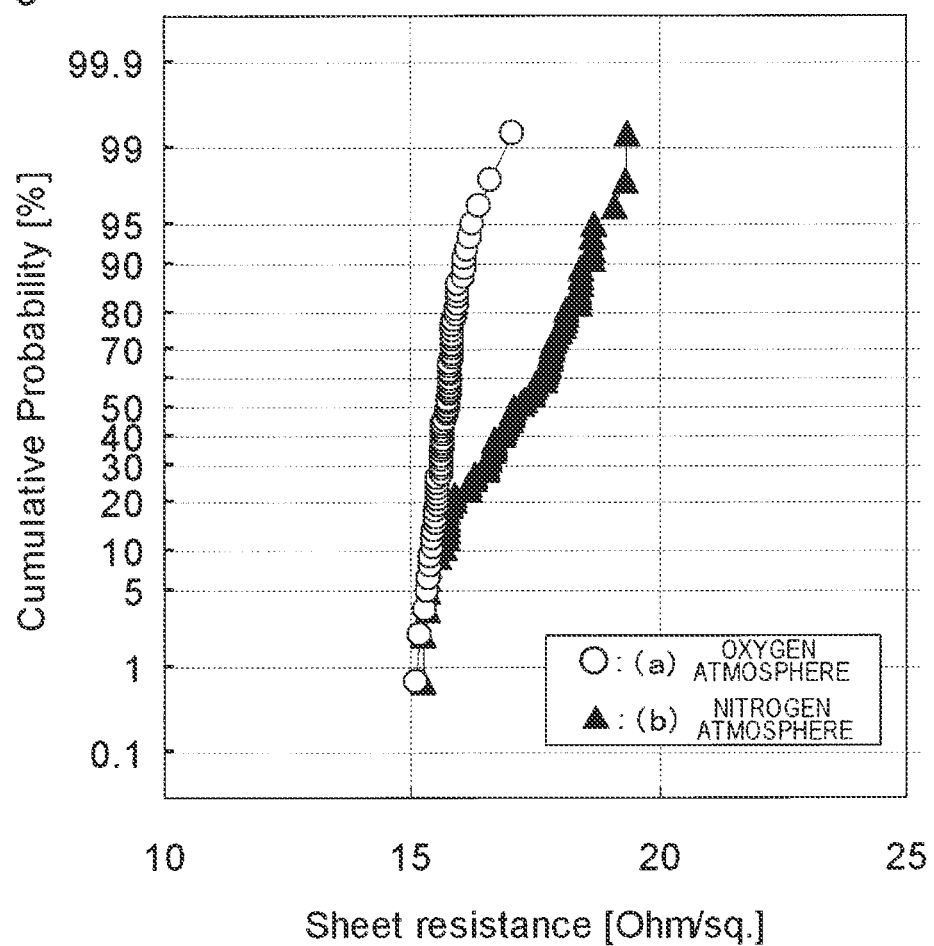
FIG. 3 is a diagram illustrating comparison of sheet resistance of a silicide film between the procedures for manufacturing the semiconductor device according to the embodiment of the invention and a comparative example.
Figure 4:
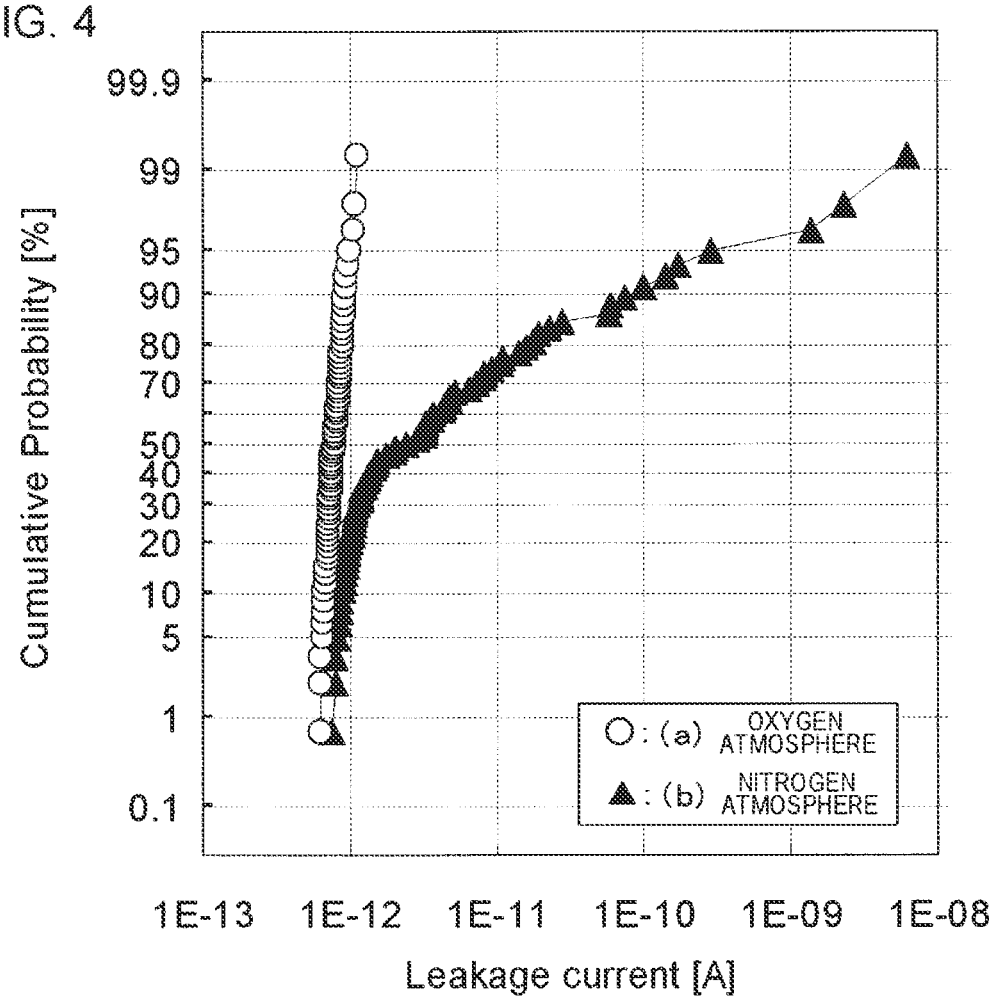
FIG. 4 is a diagram illustrating of a junction leakage current of the procedures for manufacturing the semiconductor device according to the embodiment of the invention and the comparative example.

Here, the first annealing was performed by the lamp annealing method, under the oxygen atmosphere (concentration of oxygen of 100%), at a temperature of 260° C., for 30 seconds. FIG. 3 shows the measurement result of the sheet resistance in a diffusion layer having a width of 1 μm (shown by (a) in the drawing). The horizontal axis in FIG. 3 denotes sheet resistance ([Ohm/Sq.]), and the vertical axis denotes cumulative probability ([%]). In addition, FIG. 4 shows the measurement result of the junction leakage current in a minute diffusion layer, having a width of equal to or less than 100 nm, which is adjacent to the gate electrode and the STI. The horizontal axis in FIG. 4 denotes the junction leakage current ([A]), and the vertical axis denotes cumulative probability ([%]).

In addition, as a comparative example, the sheet resistance of the silicide film was similarly measured with respect to the semiconductor device in which the first annealing was performed under the nitrogen atmosphere (shown by (b) in the drawing). Even in the example, other conditions were set to be the same as (a) except that the first annealing was performed under the nitrogen atmosphere.

As shown in FIG. 3, in (a), it was found that variation of the sheet resistance was smaller than in (b). In addition, the inventor measured the thicknesses of the silicide films of (a) and (b). As a result, in (b), it was confirmed that variation existed in the film thickness.

From the above, it is considered that the occurrence of variation of the sheet resistance, as shown in FIG. 3, in (b) is caused by the following reason. When the first annealing is performed under the nitrogen atmosphere, the crystal state of the silicide film is such that the formation of $Ni_2Si$ sufficiently proceeds at the side in contact with silicon, while the formation of $Ni_2Si$ locally insufficiently proceeds at the surface side thereof. For this reason, when the unreacted metal film is removed using a sulfuric hydrogen peroxide mixture, unreacted Ni is eluted at the surface side of the silicide film, and thus variation occurs in the final NiSi film thickness. It is necessary to uniformly form $Ni_2Si$ at the surface of the silicide film in order to prevent such variation. However, since the silicide reaction is influenced by the type of the impurity element implanted into silicon, the difference between patterns, the crystal plane of the silicide film and the like, it is difficult to improve the variation by uniformly forming $Ni_2Si$ at the surface of the silicide film.

On the other hand, in (a) manufactured by the procedure of the embodiment, the metal oxide 110 is formed on the entire surface of the metal film 108 by thermal oxidation treatment simultaneously with the formation of the first silicide film 109. Since this thermal oxidation treatment is performed on the entire surface of the metal film 108, the silicide reaction is hardly influenced by the type of the implanted impurity element, the difference between patterns, the crystal plane of the silicide film and the like on the silicon substrate 101 or the gate electrode 103, and oxidation uniformly proceeds, thereby allowing the metal oxide 110 to be formed to a uniform thickness. In addition, it is possible to prevent insufficient $Ni_2Si$ from being formed on the surface of the metal film 108. In this manner, when the unreacted metal film is removed using a sulfuric hydrogen peroxide mixture, unreacted Ni is not eluted at the surface of the first silicide film 109, and thus the thickness of the second silicide film 111 formed after that can be made uniform.

Figure 9A:
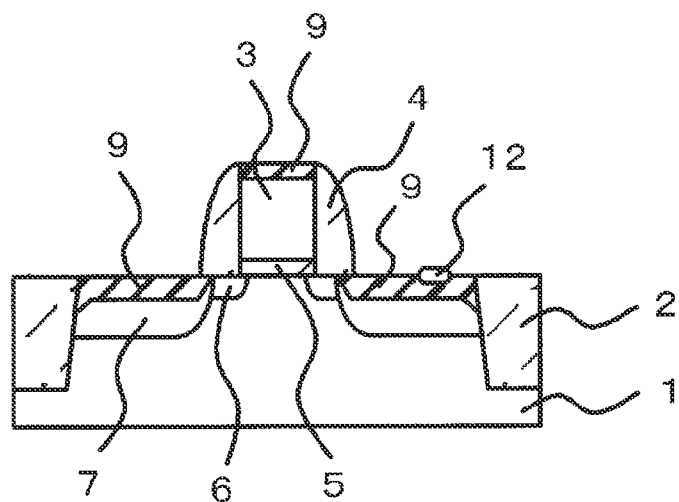
FIGS. 9A and 9B are process cross-sectional views illustrating an example of the procedures for manufacturing the semiconductor device of the related art.
Figure 9B:
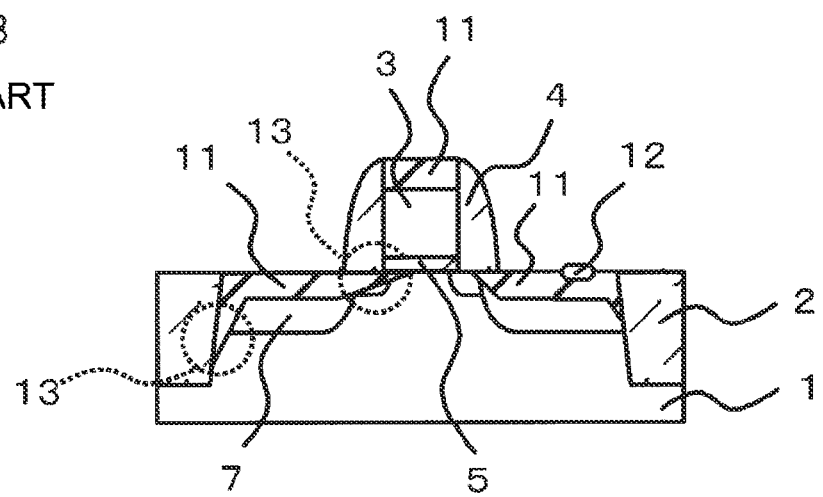

Moreover, as shown in FIG. 4, in (b), the leakage current exceeding $1 \times 10^{-11}$ A is generated in a number of samples. This shows that the abnormal growths 13 of the silicide film due to the formation of $NiSi_2$ as shown in FIG. 9B are generated with a high probability. On the other hand, according to (a), it can be found that the distribution is uniform at the minute leakage current close to $1 \times 10^{-12}$ A, and that thin and uniform NiSi is formed.

According to the procedures for manufacturing the semiconductor device 100 in the embodiment, the following effects are obtained.

In the thermal oxidation treatment step, since the surface of the metal film 108 is oxidized while performing the silicide reaction, reaction causing the generation of the oxide at the time of selectively removing the unreacted metal film 108 later using a sulfuric hydrogen peroxide mixture can prevent the insufficient silicide film from being formed.

In addition, even when the silicide reaction is performed at a low temperature, the above-mentioned reaction can prevent the insufficient silicide film from being formed, and thus the generation of the Si oxide can be prevented.

In addition, since even the surface side of the metal film 108 located on the insulating film such as the STI 102 or the sidewall 104 is oxidized to form the metal oxide 110, it is possible to prevent the extra metal material from flowing into the silicon substrate 101, and to prevent the abnormal growth due to $NiSi_2$ and the like from being generated.

Further, according to the procedures for manufacturing the semiconductor device 100 in the embodiment, since the surface of the metal film 108 is oxidized to form the metal oxide 110 while performing the silicide reaction, it is possible to achieve miniaturization, high-speed operation, low power consumption, and improvement in the yield ratio of the semiconductor element, without increasing the number of the processes.

On the other hand, in the technique disclosed in Japanese Unexamined Patent Publication No. 2010-28084, since a step of form the Ni oxide film is added after a step of forming the Ni silicide film, a long period of time is required for processing, and thus throughput is remarkably reduced. In addition, since the step of forming the Ni oxide film is added after the step of forming the Ni silicide film, excess heat is applied, and thus $NiSi_2$ is easily formed. In addition, when the heat treatment time is shortened so that $NiSi_2$ is not formed, a Ni-rich silicide film is locally formed in the silicide film similarly to the technique disclosed in Japanese Unexamined Patent Publication No. 2009-111214. For this reason, the oxide 12 as shown in FIGS. 9A and 9B is formed.

Meanwhile, the technique disclosed in Japanese Unexamined Patent Publication No. 2010-28084 discloses that the first heat treatment may be performed at the concentration of oxygen of equal to or less than 1%. However, even when the first heat treatment is performed in the conditions of the concentration of oxygen of equal to or less than 1%, the metal oxide cannot be formed to an extent that the effects as described in the embodiment are exhibited, and thus the effects of the invention cannot be obtained therein.

(Second Embodiment)

FIGS. 5A and 5B to FIGS. 7A and 7B are process cross-sectional views illustrating an example of the procedures for manufacturing the semiconductor device 100 according to the embodiment.

Figure 5A:
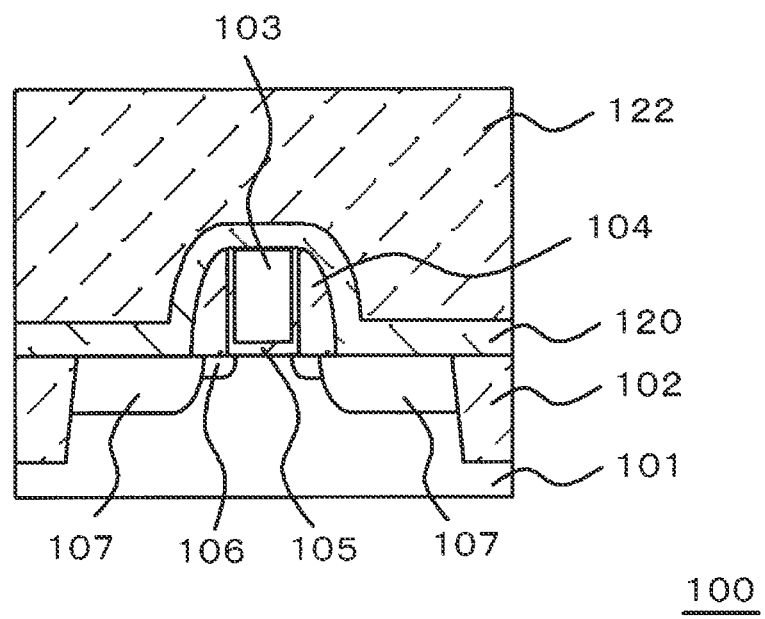
FIGS. 5A and 5B are process cross-sectional views illustrating an example of the procedures for manufacturing the semiconductor device according to the embodiment of the invention.

First, using a well-known method, the semiconductor element is created by forming, on the, silicon substrate 101, the STI 102 used as an element isolation insulating film, a gate electrode 103, the sidewall 104, the gate insulating film 105, the extension region 106, and the source/drain region 107. Meanwhile, the source/drain region 107 can be formed of materials such as SiGe and SiC. Next, a liner insulating film 120 and an insulating interlayer 122 are formed on the entire surface of the silicon substrate 101, and the insulating film is planarized by a chemical mechanical polishing (CMP) method (FIG. 5A). In the embodiment, the gate electrode 103 can be formed of, for example, a metal material.

Figure 5B:
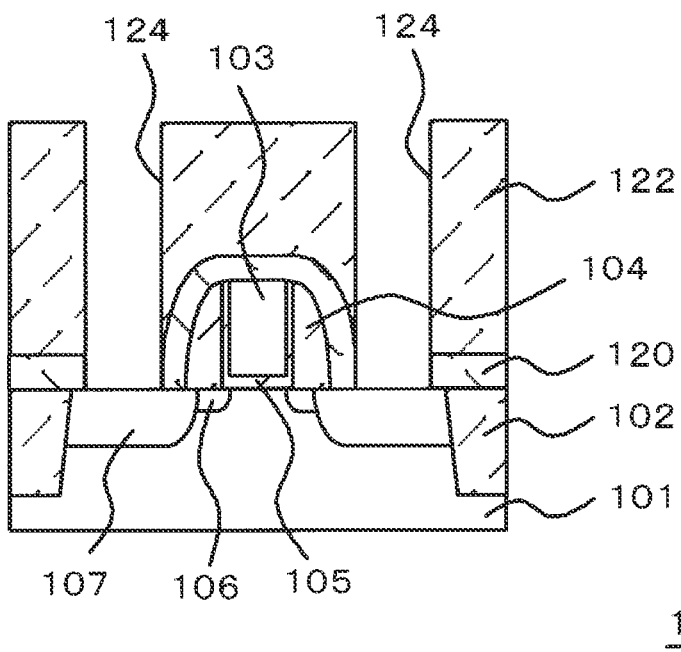

Subsequently, using a photolithographic technique and a reactive ion etching (RIE) technique, a through hole 124 is formed in the insulating interlayer 122 and the liner insulating film 120, and the source/drain region 107 is exposed at the bottom of the through hole 124 (FIG. 5B). Meanwhile, herein, though an example in which the through hole 124 is connected to the source/drain region 107 is shown, it can also be replaced with a trench.

Next, a natural oxide film formed on the source/drain region 107 is removed using a well-known chemical dry cleaning technique and the like (Japanese Unexamined Patent Publication No. 2007-281298).

Figure 6A:
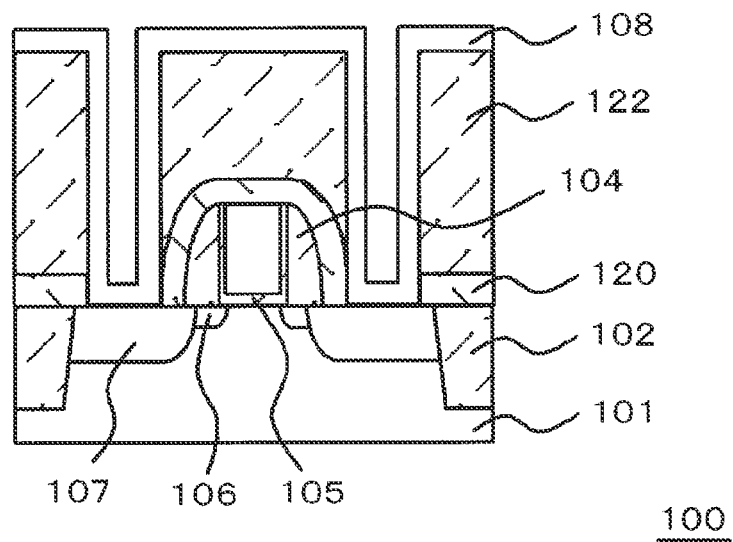
FIGS. 6A and 6B are process cross-sectional views illustrating an example of the procedures for manufacturing the semiconductor device according to the embodiment of the invention.

Thereafter, the metal film 108 for performing the silicide reaction is formed on the entire surface of the silicon substrate 101 by the sputtering method (FIG. 6A). Here, the metal film 108 can also be formed using the same material as described in the first embodiment. In the embodiment, hereinafter, a case where the metal film 108 is a Ni—Pt alloy film will be described by way of example.

Figure 6B:
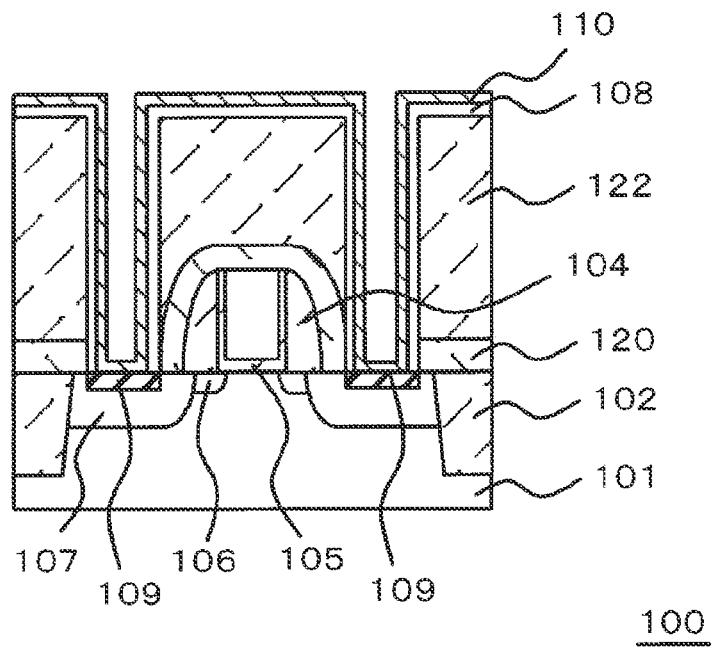

Next, the first silicide film 109 and the metal oxide 110 are formed by performing the first annealing (first heat treatment) (FIG. 6B). The conditions of the first annealing can also be set to be the same as those in the first embodiment. Here, the metal film 108 in contact with the liner insulating film 120 or the insulating interlayer 122 becomes the unreacted metal film 108 as it is, and the surface side thereof becomes the metal oxide 110.

Figure 7A:
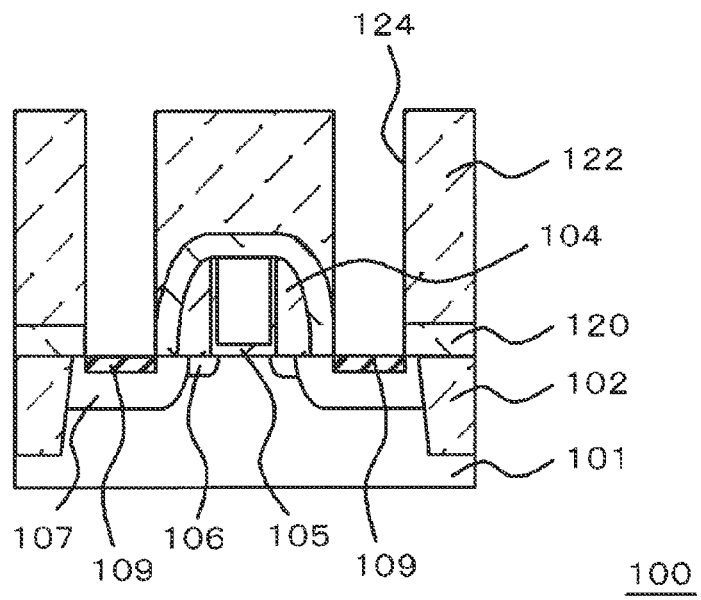
FIGS. 7A and 7B are process cross-sectional views illustrating an example of the procedures for manufacturing the semiconductor device according to the embodiment of the invention.

Next, the metal oxide 110 and the unreacted metal film 108 located on the insulating film are selectively removed using a sulfuric hydrogen peroxide mixture (FIG. 7A). The constitution of the sulfuric hydrogen peroxide mixture can also be set to be the same as that in the first embodiment. Thereby, it is possible to prevent the remainder of the metal oxide 110 or the remainder of Ni or Pt derived from the unreacted metal film 108 from being generated.

Figure 7B:
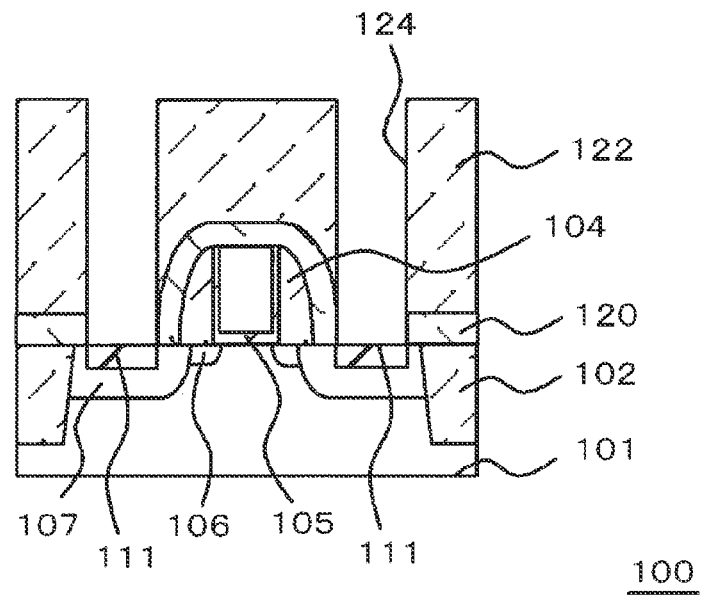
Figure 8A:
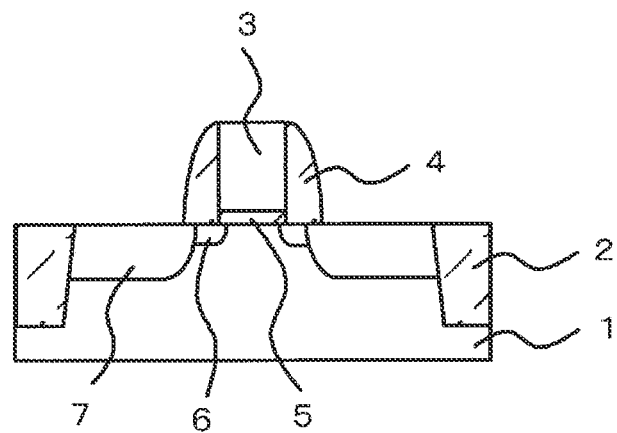
FIGS. 8A to 8C are process cross-sectional views illustrating an example of procedures for manufacturing the semiconductor device of the related art.
Figure 8B:
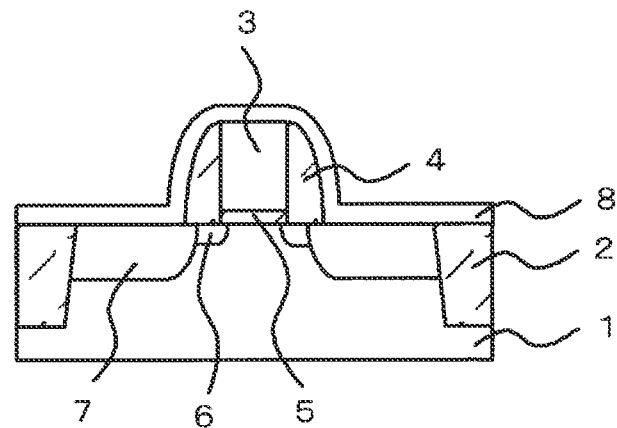
Figure 8C:
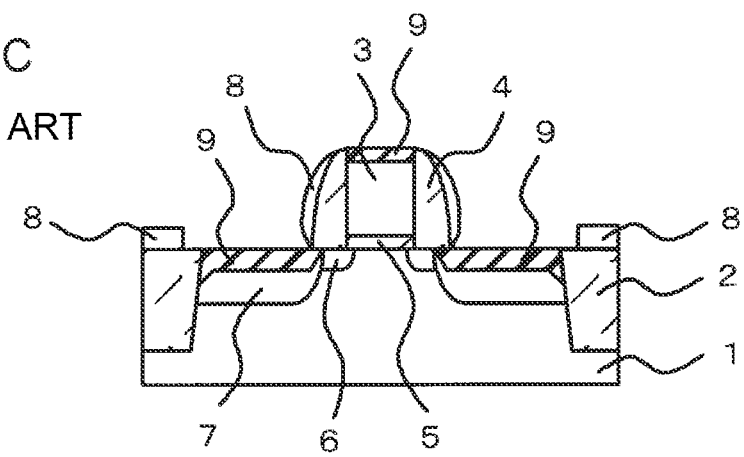

Next, the first silicide film 109 is phase-transferred by performing the second annealing, and thus the second silicide film 111 having a lower resistance is formed (FIG. 7B). The conditions of the second annealing can also be set to be the same as those in the first embodiment. From the above, in the embodiment, the semiconductor device 100 having the second silicide film 111 is manufactured. Thereafter, a contact to be connected to the source/drain region 107 can be formed by filling the inside of the through hole (or trench) 124 with a conductive material. Even in the embodiment, the same effects as those in the first embodiment are obtained.

As described above, although the embodiments of the invention have been set forth with reference to the drawings, it is merely illustrative of the invention, and various configurations other than those stated above can be adopted.

It is apparent that the present invention is not limited to the above embodiment, and may be modified and changed without departing from the scope and spirit of the invention.

What is claimed is:

1. A method of manufacturing a semiconductor device, said semiconductor device comprises a silicide film in a silicon region, which comprises silicon as a main ingredient, isolated by an insulating film, comprising:

forming a source/drain region of a transistor in the silicon region;

forming a metal film over said silicon region and said insulating film;

performing a first heat treatment under an oxygen atmosphere containing oxygen as a main ingredient, to form said silicide film on the source/drain region in said silicon region by reacting said metal film and said source/drain region, and to simultaneously form a metal oxide film by oxidizing the entire surface of said metal film from the surface side thereof; and selectively removing said metal oxide film and said unreacted metal film using a chemical solution.

2. The method of manufacturing a semiconductor device according to claim 1, wherein said first heat treatment is performed under an oxygen atmosphere of oxygen alone.

3. The method of manufacturing a semiconductor device according to claim 1, further comprising performing a second heat treatment at a temperature higher than the temperature of said first heat treatment to increase the silicon content in said silicide film, after said selectively removing said metal oxide film and said unreacted metal film.

4. The method of manufacturing a semiconductor device according to claim 3, wherein said second heat treatment is performed under an inert gas atmosphere.

5. The method of manufacturing a semiconductor device according to claim 3, said second heat treatment is performed under a nitrogen atmosphere.

6. The method of manufacturing a semiconductor device according to claim 3, wherein said metal film includes Ni and,
   in said performing the first heat treatment, the crystal phase of said silicide film is dinickel silicide ($Ni_2Si$), and in said performing the second heat treatment, the crystal phase of said silicide film is nickel monosilicide (NiSi).

7. The method of manufacturing a semiconductor device according to claim 1, wherein said metal film is a monolayer film or a laminated film including at least one of Ni or Ni alloy.

8. The method of manufacturing a semiconductor device according to claim 7, wherein said Ni alloy includes at least one of Pt or Pd.

9. The method of manufacturing a semiconductor device according to claim 1, wherein said chemical solution is a sulfuric hydrogen peroxide mixture.

* * * * *